(12) United States Patent
Zhou et al.

(10) Patent No.: US 6,577,177 B2
(45) Date of Patent: *Jun. 10, 2003

(54) NON-LINEAR DISTORTION GENERATOR (75) Inventors: Shutong Zhou, Lansdale, PA (US);
Timothy J. Brophy, Holland, PA (US);
Richard A. Meier, Roslyn, PA (US)

(73) Assignee: General Instrument Corporation, Horsham, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/282,958

(22) Filed: Apr. 1, 1999

(65) Prior Publication Data
US 2001/0054927 A1 Dec. 27, 2001

(51) Int. Cl.[7] .............................................. H04B 10/00
(52) U.S. Cl. ...................... 327/317; 327/133; 327/308; 330/149; 333/81 R
(58) Field of Search ................ 327/551, 133, 327/317, 362, 378, 308, 306; 333/81 R; 330/149

(56) References Cited

U.S. PATENT DOCUMENTS

| | | | | |
|---|---|---|---|---|
| 4,808,810 A | 2/1989 | Van Doorn | ................ | 250/214 |
| 4,882,482 A | 11/1989 | Smith et al. | ................ | 330/308 |
| 4,992,754 A | 2/1991 | Blauvelt et al. | ............ | 330/149 |

(List continued on next page.)

FOREIGN PATENT DOCUMENTS

| | | |
|---|---|---|
| DE | 3024533 | 1/1982 |
| DE | 3338024 | 5/1985 |
| DE | 4212772 | 10/1993 |
| DE | 2656436 | 6/1998 |
| EP | 0486953 A2 | 11/1991 |
| EP | 0498456 | 2/1992 |
| EP | 0552316 | 2/1992 |
| EP | 0620661 | 10/1994 |
| GB | 1381597 | 1/1975 |
| GB | 2164515 | 3/1986 |
| WO | 9735390 | 9/1997 |

OTHER PUBLICATIONS

Bertelsmeier et al., Linearization of Broadband Optical Transmission Systems by Adaptive Predistortion, 1984, pp. 206–212.

Eggers, 2GHz Bandwidth Predistortion Linearizer For Microwave Power Amplifiers At Ku–Band, pp. 1501–1505, Sep. 1994.

Eggers, Pamela—Linearized Solid State Power Amplifier At Ku–band Frequency, pp. 443–445 Sep. 1993.

Optical Receiver Front–End Nonlinear Distortion, Electronics Letters, Apr. 29, 1982, vol. 18, No. 9, pp. 361–362.

(List continued on next page.)

Primary Examiner—Dinh T. Le
(74) Attorney, Agent, or Firm—Volpe and Koenig, P.C.

(57) ABSTRACT

An in-line distortion generator for coupling in-line with a non-linear device (NLD) produces an output signal of useful amplitude, but with low composite triple beat and cross modulation distortions. The distortion generator comprises an instant controlled non-linear attenuator which utilizes the non-linear current flowing through a pair of diodes to provide the proper amount of signal attenuation over the entire frequency bandwidth. The distortion generator circuitry is always matched to the NLD, thereby ensuring a frequency response that is predictable and predefined. The distortion generator may also include a temperature compensation circuit to ensure consistent operation throughout a wide temperature range.

9 Claims, 3 Drawing Sheets

U.S. PATENT DOCUMENTS

| | | | |
|---|---|---|---|
| 4,998,012 A | 3/1991 | Kruse | 250/214 A |
| 5,161,044 A | 11/1992 | Nazarathy et al. | 359/157 |
| 5,172,068 A | 12/1992 | Childs | 327/100 |
| 5,321,710 A | 6/1994 | Cornish et al. | 330/163 |
| 5,418,637 A | 5/1995 | Kuo | 359/161 |
| 5,424,680 A | 6/1995 | Nazarathy et al. | 330/149 |
| 5,455,705 A | 10/1995 | Gusinov | 375/296 |
| 5,481,389 A | 1/1996 | Pidgeon et al. | 359/161 |
| 5,523,716 A | 6/1996 | Grebliunas et al. | 330/149 |
| 5,568,087 A | 10/1996 | Gatti | 330/149 |
| 5,572,161 A * | 11/1996 | Myers | 327/378 |
| 5,589,797 A | 12/1996 | Gans et al. | 330/149 |
| 5,600,472 A * | 2/1997 | Uesaka | 330/149 |
| 5,703,530 A | 12/1997 | Sato et al. | 330/149 |
| 5,752,174 A | 5/1998 | Matai et al. | 455/302 |
| 5,798,854 A | 8/1998 | Blauvelt et al. | 359/161 |
| 5,850,305 A | 12/1998 | Pidgeon | 359/187 |
| 5,909,642 A | 6/1999 | Suzuki | 455/114 |
| 6,069,534 A | 5/2000 | Kobayashi | 330/308 |
| 6,107,877 A | 8/2000 | Miguelez et al. | 330/149 |
| 6,122,085 A | 9/2000 | Bitler | 359/180 |
| 6,204,718 B1 | 3/2001 | Pidgeon, Jr. | 327/316 |

OTHER PUBLICATIONS

Khilla et al., Semiconductor Transmitter Amplifiers And Traveling Wave Tube Linears For Future Communications Satellites, 8273 ANT Telecommunications Engineering Reports, No. 8, Feb. 1991 (including English translation).

Locatelli et al., Microwave Linear Power Amplifier With Micromodule Technology, pp. 1.3.1–1.3.6, Jun. 1987.

Ohr, GaAs Finds Home In Wireless & High–Speed Data–Communications Applications, Computer Design, Mar. 1994, pp. 59–68.

Kobayashi et al., A Novel Monolithic Linearized HEMT LNA Using HBT Tuneable Active Feedback, IEEE MTT–S International Microwave Symposium Digest, pp. 1217–1220, Jun. 1996.

* cited by examiner

NON-LINEAR DISTORTION GENERATOR

BACKGROUND OF THE INVENTION

1. Field of the Invention

The present invention relates generally to communication systems employing amplification devices. More particularly, the invention pertains to a non-linear predistortion or postdistortion generator for coupling in-line with an amplifier, optical detector or laser to minimize the signal distortion caused by amplification.

2. Description of the Related Art

Amplifiers are widely used in many types of communication applications. Although it is preferable to keep amplifiers within their linear range of operation, it has been increasingly necessary to extend the operation of amplifiers into high power and high frequency regions of operation. Typically, the output power of an amplifier is limited by the non-linearity of the active devices, including bipolar transistors and FETs. These non-linearities result in distortions which are impressed upon the signal being amplified. Reducing the non-linear distortions of an amplifier results in increases of the output power, the system dynamic range and the carrier-to-noise ratio. Accordingly, minimizing distortions and achieving linear frequency response is paramount to efficient amplifier operation.

Minimizing distortion is particularly important when a series of amplifiers is cascaded over a signal transmission path, such as a series of RF amplifiers in a CATV transmission system. Disposed throughout a CATV transmission system are RF amplifiers that periodically amplify the transmitted signals to counteract cable attenuation and attenuation caused by passive CATV components, such as signal splitters and equalizers. The RF amplifiers are also employed to maintain the desired carrier-to-noise ratio. Due to the number of RF amplifiers employed in a given CATV transmission system, each RF amplifier must provide minimum degradation to the transmitted signal.

Many amplifiers are subject to a wide range of ambient operating temperatures. These temperature changes may affect the operating characteristics of certain electronic components within the amplifier, thereby inducing additional distortions. A temperature range of $-40°$ C. to $+85°$ C. is not uncommon for many amplifier applications in a communication environment. To ensure consistent performance over the operating bandwidth, and to minimize resulting distortions, an amplifier must be designed for a broad range of ambient operating temperatures.

The distortions created by an amplifier which are of primary concern are second (even) and third (odd) order harmonic intermodulation and distortions. Prior art amplifier designs have attempted to ameliorate the effects of even order distortions by employing push-pull amplifier topologies, since the maximum second order cancellation occurs when the proper 180° phase relationship is maintained over the entire bandwidth. This is achieved through equal gain in both push-pull halves by matching the operating characteristics of the active devices.

However, odd-order distortion is difficult to remedy. Odd-order distortion characteristics of an amplifier are manifest as cross modulation (X-mod) and composite triple beat (CTB) distortions on the signal being amplified. X-mod occurs when the modulated contents of one channel being transmitted interferes with and becomes part of an adjacent or non-adjacent channel. CTB results from the combination of three frequencies of carriers occurring in the proximity of each carrier since the carriers are typically equally spaced across the frequency bandwidth. Of the two noted distortions, CTB becomes more problematic when increasing the number of channels on a given CATV system. While X-mod distortion also increases in proportion to the number of channels, the possibility of CTB is more dramatic due to the increased number of available combinations from among the total number of transmitted channels. As the number of channels transmitted by a communication system increases, or the channels reside close together, the odd-order distortion becomes a limiting factor of amplifier performance.

There are three basic ways of correcting distortion created by a non-linear device (NLD): 1) reduce the signal power level; 2) use a feed forward technique; and 3) use a predistortion or postdistortion technique. The first method reduces the signal power level such that the NLD is operating in its linear region. However, in the case of an RF amplifier this results in very high power consumption for low RF output power.

The second method is the feed forward technique. Using this technique, the input signal of the main amplification circuit is sampled and compared to the output signal to determine the difference between the signals. From this difference, the distortion component is extracted. This distortion component is then amplified by an auxiliary amplification circuit and combined with the output of the main amplification circuit such that the two distortion components cancel each other. Although this improves the distortion characteristics of the amplifier, the power consumed by the auxiliary amplification circuit is comparable to that consumed by the main amplification circuit. This circuitry is also complex and very temperature sensitive.

The third method is the predistortion or postdistortion technique. Depending upon whether the compensating distortion signal is generated before the non-linear device or after, the respective term predistortion or postdistortion is used. In this technique, a distortion signal equal in amplitude but opposite in phase to the distortion component generated by the amplifier circuit is estimated and generated. This is used to cancel the distortion at the input (for predistortion) or output (for postdistortion) of the amplifier, thereby improving the operating characteristics of the amplifier.

Figure 1:
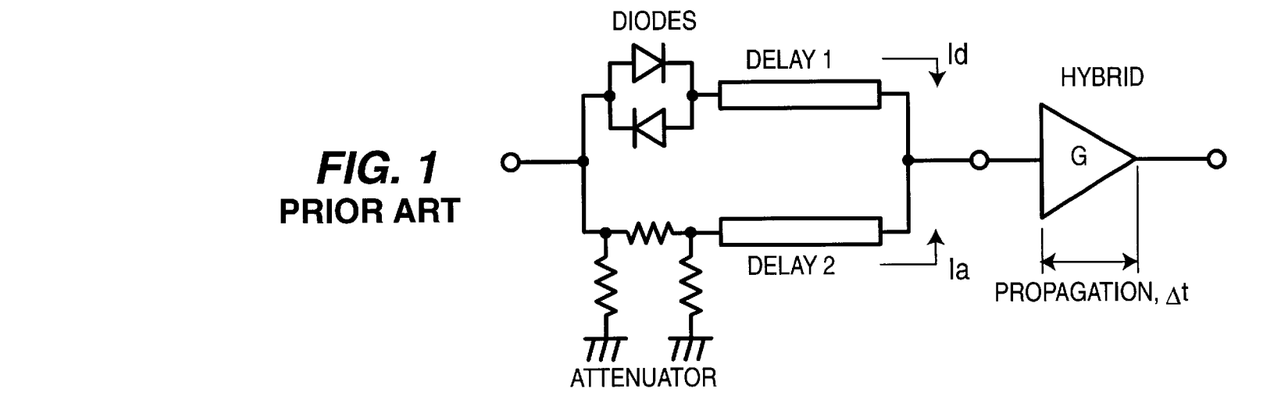
FIG. 1 is a schematic diagram of a prior art distortion generator.
Figure 2:
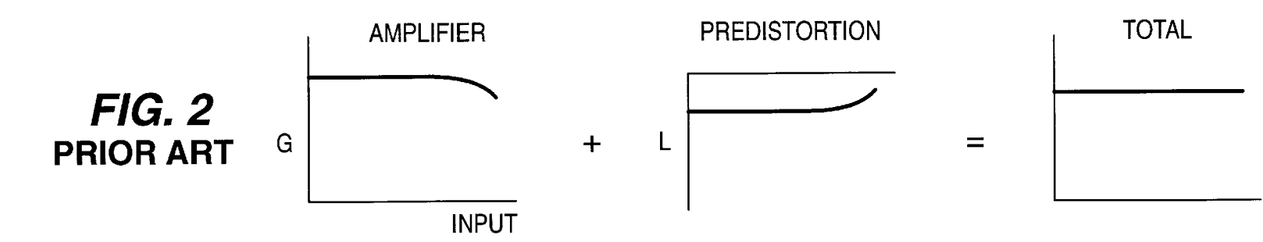
FIG. 2 is a combination plot of the effect of using the outputs from the prior art distortion generator shown in FIG. 1 with an RF amplifier.
Figure 3:
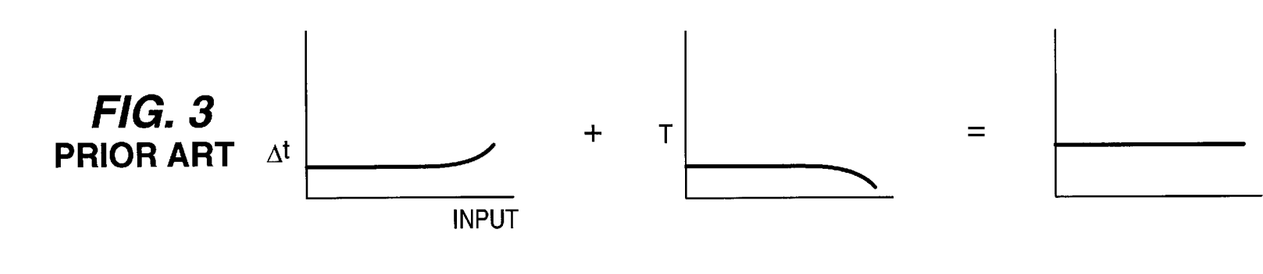
FIG. 3 is a combination plot of the effect of using the outputs from the prior art distortion generator shown in FIG. 1 with an RF amplifier.

One such distortion design, as disclosed in U.S. Pat. No. 5,703,530 and shown in FIG. 1, relies upon a traditional π-attenuation network and a delay line for gain compensation; and a diode pair coupled with a delay line for distortion and phase compensation. This circuit generates a distortion that is equal in amplitude but opposite in phase to the distortion introduced by the amplifier. Plots of the distortions contributed by the distortion generator and the distortions manifest by the amplifier are shown in FIGS. 2 and 3. As shown, the distortion signal compensates for the distortions generated by the amplifier. However, the use of delay lines in such a manner is impractical since delay lines are physically large, are difficult to adjust and the results are inconsistent across a wide frequency range. Additionally, both amplitude and phase information are required for correct compensation. The '530 patent also states that the system disclosed therein is not ideal for certain application, such as predistortion for CATV RF amplifiers, due to the excessive losses introduced by the distortion circuit.

An inline predistortion design, as disclosed in U.S. Pat. No. 5,798,854, provides compensation for NLDs by applying a predistorted signal equal in magnitude but opposite in phase to the distortion produced by the NLD. However, the circuitry disclosed therein is not matched to the NLD. Additionally, the '854 patent presents a design that is typical of the prior art in the use of a high resistance bias for the diodes. This will reduce the correction efficiency and increase the effects of temperature upon the circuit.

Accordingly, there exists a need for a simple distortion generator which counteracts the distortion created by an NLD. The circuit should not introduce additional signal delay and should operate over a wide frequency bandwidth and wide ambient temperature range.

SUMMARY OF THE INVENTION

The present invention is an in-line predistortion or post-distortion generator for coupling in-line with an NLD to produce an output signal of useful amplitude, but with low composite triple beat and cross modulation distortions. The distortion generator comprises an instant controlled non-linear attenuator which utilizes the non-linear current flowing through a pair of diodes to provide the proper amount of signal attenuation over the entire frequency bandwidth. The distortion generator circuitry is always matched to the NLD, thereby ensuring a frequency response that is predictable and predefined. The distortion generator also includes a temperature compensation circuit to ensure consistent operation throughout a wide temperature range.

Accordingly, it is an object of the present invention to provide a temperature compensated distortion generator which minimizes cross modulation and composite triple beat distortions manifested by an NLD such as an RF amplifier, a laser diode or a photodetector.

Other objects and advantages of the of the present invention will become apparent to those skilled in the art after reading a detailed description of the preferred embodiment.

DESCRIPTION OF THE PREFERRED EMBODIMENTS

The preferred embodiment of the present invention will be described with reference to the drawing figures where like numerals represent like elements throughout. Although the preferred embodiment of the present invention will be described, for simplicity of explanation, as being coupled with an RF amplifier, those skilled in the art would clearly recognize that such a distortion generator could also be utilized to compensate for distortion in laser transmitters, optical detectors, and other electronic components which operate over a wide range of frequencies. The description herein is not intended to be limiting, rather it is intended to be illustrative.

The present invention will be described with reference to FIG. 4, whereby a π attenuator network 20 is shown. The network 20 comprises a selected configuration of resistors $Z_1$, $R_1$, $R_2$, $R_3$, $Z_0$, $R_p$. The signal source is input at signal input 30 and the output of the attenuator network 20 is seen across the output 95. $Z_1$ is the source of internal impedance which should be equal to the system impedance $Z_0$, which is seen across the output 95. In an embodiment of the invention for use with a CATV system, the impedance values $Z_1$ and $Z_0$ are equal to 75 Ohms. Three of the resistors $R_1$, $R_2$, $R_3$ form a π attenuator configuration. Preferably, the values (Y) of resistors $R_2$ and $R_3$ are equal, and substantially larger than the value (X) of resistor $R_1$. Resistor $R_p$ is connected in parallel with resistor $R_1$.

As one skilled in the art would clearly recognize, when the following condition is satisfied:

$$X = 2Z_0^2 Y/(Y^2 - Z_0^2) \qquad \text{Equation (1)}$$

the attenuator network 20 is matched at input and output, from DC to very high frequencies. For one example of the attenuator when X=7.5 and Y=1.5K, the power attenuation A for this attenuator network 20 is:

$$A = \left( \frac{\frac{2(YZ_0/(Y+Z_0)+X)Y(YZ_0/(Y+Z_0))}{(Y+X+YZ_0/(Y+Z_0))(X+(YZ_0/(Y+Z_0)))}}{Z_0 + \frac{(YZ_0/(Y+Z_0)+X)Y}{Y+X+YZ_0/(Y+Z_0)}} \right)^2 \qquad \text{Equation (2)}$$

Under the condition when $Z_0 \ll Y$, (as is the case when X=7.5 and Y=1.5K):

$$A \approx (2Z_0/(2Z_0+X))^2 \qquad \text{Equation (3)}$$

$$A(dB) = 10 \lg A \qquad \text{Equation (4)}$$

When X=7.5 and Y=1.5k, A(dB)≅0.42 dB. This means the attenuator network 20 has very low insertion losses and a good frequency response. When X has a small variation due to the parallel of $R_p$, shown in FIG. 4, from Equation (3)

$$\text{Delta } A\,(dB) \cong -8.68 \, \frac{\text{Delta } X}{2Z_0 + X} \qquad \text{Equation (5)}$$

$$\text{Delta } X = \frac{XR_p}{X + R_p} - X = -\frac{X^2}{R_p} \qquad \text{Equation (6)}$$

From Equation (6):

$$\text{Delta } A\,(dB) \cong 8.68 \, \frac{X^2}{2Z_0 R_p} \qquad \text{Equation (7)}$$

For example, If $R_p$=375 ohms then:

$$\text{Delta } A\,(dB) \cong 8.68 \, \frac{7.5}{150} \, \frac{7.5}{375} = 0.00868 \text{ dB} \qquad \text{Equation (8)}$$

Equation (8) shows that when $R_p$ (375 ohms) is in parallel with $R_1$ (7.5 ohms), the attenuation will be reduced by 0.00868 dB. This amount of attenuation change is needed for non-linear compensation for an amplifier. This example also shows that when the value of $R_p \gg R_1$, (i.e., when $R_p$ is 50 times larger than $R_1$), adding $R_p$ parallel with $R_1$ has almost no effect on the impedance match, and the voltage drop over the $R_p$ is mainly determined by the value of $R_1$.

However, if a linear resistor $R_p$ is used in the attenuator network 20, there will be no distortion signal produced. The attenuator network 20 as shown is a linear device. In order for a distortion circuit to operate effectively, diodes are used to create a non-linear resistance. Preferably, Schottky diodes are utilized. At small current, diode current is exponentially proportional to the voltage across over the diode. Thus diodes can be used as a non-linear resistance. For non-linear applications, the amount of attenuation can be calculated as:

$$\text{Delta } A \text{ (dB)} = 8.68 \frac{X}{2Z_0} \frac{X}{R_p} = 8.68 \frac{X}{2Z_0} \frac{I_p}{I_1} \quad \text{Equation (9)}$$

Where $I_p$ is the current flow through $R_p$, (the non-linear resistance). $I_1$ is the current flow through $R_1$. Equation 9 provides the relationship of the attenuation change due to the current change in $I_p$. This equation is accurate over a broad frequency range. The relationship between the delta attenuation and a change in current is still valid when the resistance is a non-linear resistor. Accordingly, Equation 9 provides a good estimation of how much non-linear current is required for predistortion or postdistortion purposes.

Figure 5:
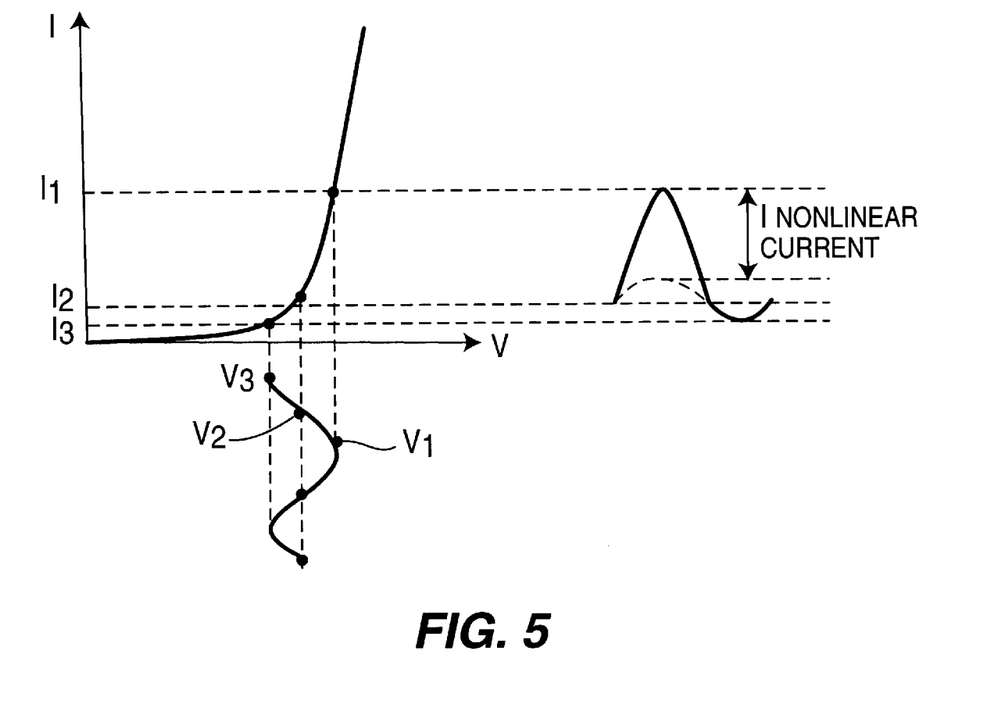
FIG. 5 is a signal diagram of the diode non-linear current caused by the input voltage.

Referring to FIG. 5, when the input sinusoidal voltage wave changes from $V_1$ to $V_2$ to $V_3$, the output current changes from $I_1$ to $I_2$ to $I_3$ respectively. The non-linear current used for third order correction is:

$$I_{nonlinear} \cong I_1 - 2I_2 + I_3 \quad \text{Equation (10)}$$

From Equation 9, the non-linear current needed is:

$$\text{Delta } A_{nonlinear\ correction} \text{ (dB)} \cong 8.68 \frac{X}{2Z_0} \frac{I_{nonlinear}}{I_{output}} \quad \text{Equation (11)}$$

Only non-linear current will be useful for predistortion or postdistortion purposes. Equation 11 can be rewritten in the form of:

$$\text{Delta } A_{nonlinear\ correction} \text{ (dB)} \cong 8.68 \frac{I_{nonlinear\ eff}}{I_{output}} \quad \text{Equation (12)}$$

$$I_{nonlinear\ eff} \cong \frac{I_{nonlinear}}{R_1/(2Z_0)} \quad \text{Equation (13)}$$

Figure 6:
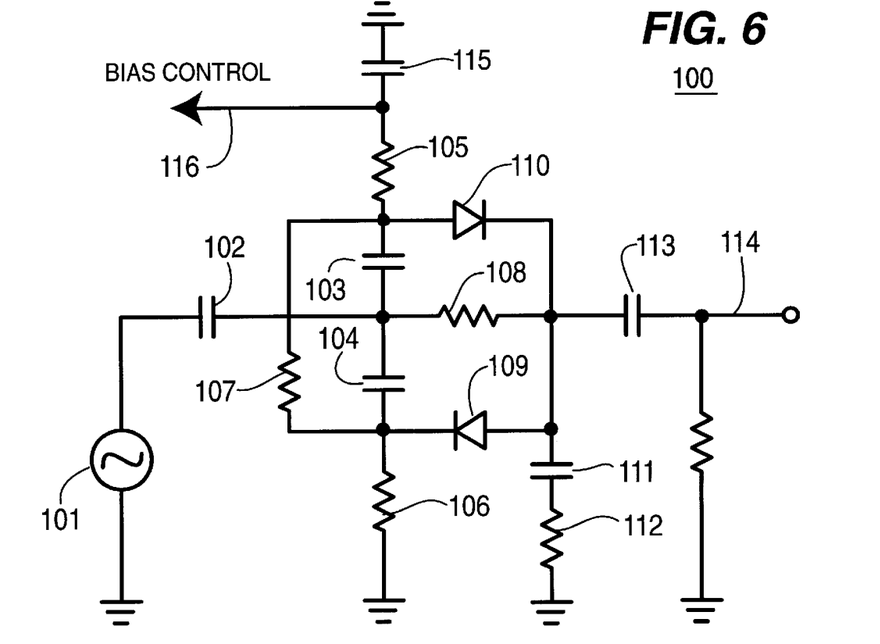
FIG. 6 is a schematic diagram of the preferred embodiment of the distortion generator of the present invention.

Accordingly, $I_{non-linear\ eff}$ in Equation 12 is the effective non-linear current going to the output port 114 which is shown in FIG. 6. $I_{output}$ in Equation 12 is the total current that goes to the output port 114. Equation 13 shows that only a small part of the non-linear diode current is effectively being used for correction.

The π attenuator network 20 has low insertion loss and the voltage drop of the input voltage on $R_1$ (shown in FIG. 4) is proportional to the input voltage. This voltage may be used to drive a pair of diodes to produce non-linear current. The non-linear current flowing in the diodes will cause an attenuator to provide less attenuation at larger RF amplitudes, (i.e. when the input signal has a higher power). This may be used to compensate for the signal compression caused by amplification. Because of the relatively high value of the diode's non-linear resistance, the match of the attenuator network is almost unchanged. This match will not be changed even over temperature. Additionally, frequency response over multi-octave frequency bands is favorable.

Referring to FIG. 6, the preferred embodiment of the attenuator 100 for predistortion and postdistortion is shown. The attenuator 100 of the present invention includes several additional components that modify a traditional π attenuator to achieve significantly better performance over a wide frequency and temperature range. The attenuator 100 has an input port 101, an output port 114 and a bias control port 116. The attenuator 100 may be used in a predistortion configuration with an amplifier or in a postdistortion configuration. For a predistortion configuration, the output port 114 is connected to the input of an amplifier. For the postdistortion configuration as shown in FIG. 6, an output signal generated by an amplifier, is applied to the input port 101. The attenuator 100 includes resistors 105, 106, 107, 108, 112; capacitors 102, 103, 104, 111, 113, 115; and diodes 109, 110.

Figure 4:
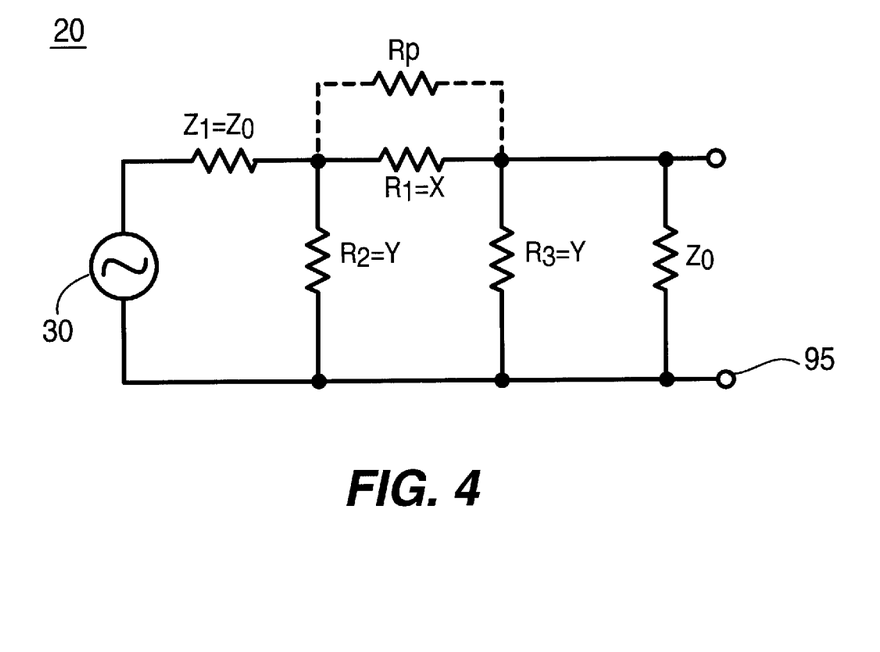
FIG. 4 is schematic diagram of a π attenuator.

The function of the resistors 105, 106, 107, 108, 112 and the capacitors 102, 103, 104, 111, 113, 115 is to form a modified π attenuation network in comparison to the π attenuation network 20 shown in FIG. 4. The capacitors 102, 103, 104, 111, 113, and 115 are also used for DC blocking and AC coupling. From an AC standpoint, the parallel combination of resistors 105 and 106 is functionally equivalent to resistor $R_2$ of FIG. 4. Preferably, the values of resistors 105 and 106 should be chosen such that the parallel combination is equivalent to the value of resistance of resistor 112, (i.e. $((R_{105}*R_{106})/(R_{105}+R_{106}))=R_{112}$). Resistor 108 is functionally equivalent to resistor $R_1$ of FIG. 4; and the in-series combination of resistor 112 and capacitor 111 is functionally equivalent to resistor $R_3$ of FIG. 4. The value of resistor 107 has no effect on signal attenuation.

The other function for resistors 105, 106, and 107 is to supply a DC bias to the diodes 109, 110. The diodes 109, 110 are first connected in series; and the series combination is connected to resistor 107 in parallel. Because resistor 107 has a low resistance value and is in parallel with the diodes 109, 110, the voltage drop across the diodes 109, 110 will be primarily determined by the resistance of resistor 107. If the current flow in resistor 107 is much more than the current flow in the diodes 109, 110 the voltage drop across the diode 109, 110, will be very stable and will be insensitive to the presence or absence of a signal at the input port 101.

The integrated functions of signal attenuation and diode bias supply avoid any parasitic effects due to the introduction of additional bias circuitry. This permits a high frequency response and a favorable impedance match.

From an DC perspective, resistor 107, in parallel with capacitors 103 and 104, provides a dissipative circuit to the capacitors 103, 104. Therefore, resistor 107 will discharge the accumulated electric charge of connected capacitors 103, 104 in every AC cycle.

Diode 109 is connected to resistor 108 through capacitor 104 while diode 110 is connected to resistor 108 through capacitor 103. Diode 109 is responsible for the RF distortion correction during the negative portion of the AC cycle, while the diode 110 has the same function during the positive half of the AC cycle. The non-linear current of diode 109 charges capacitor 104, and the non-linear current of diode 110 charges capacitor 103. Due to the configuration of the circuit, the voltage produced on capacitors 103 and 104 have the same value but different signs. The small resistance from resistor 107 connected to the capacitors 103, 104 discharges the accumulated electric charge during every AC cycle. As a result, there is no voltage drop across the capacitors 103, 104. This permits the diode 109, 110 to provide the largest non-linear current for the correction purpose.

The present invention has several unique advantages over the prior art. Due to its symmetric structure, the attenuator 100 produces only odd order distortion. Consequently, the circuit does not degrade the second order performance of an NLD. The attenuator 100 also uses two low series resistances 107, 108. From a DC perspective, resistor 107 significantly improves the correction efficiency and reduces the susceptibility to ambient temperature effects. From an AC perspective, resistor 108 provides for distortion correction with low insertion losses. Due to the attenuator 100 design, the voltage drop across resistor 108 fully loads the diodes 109, 110 even under non-linear operation of the diodes 109, 110. As a result, maximum non-linear current is utilized for correction purposes. Finally, proper phasing of the distortion signals is inherent in the design, thereby avoiding additional phase circuitry and delay lines. This permits a circuit design which is much less complex and results in a compact and robust design.

Table 1 provides a listing of the components shown in FIG. 6. However, one skilled in the art would clearly recognize that the values shown in Table 1 are only for explanatory purposes, and should not be considered to be limiting to the invention. For example, the value of resistor 108 may range from approximately 2 Ω to 30 Ω. Likewise, the value of resistor 107 may range from approximately 100 Ω to 3000 Ω.

TABLE 1

| COMPONENT | VALUE OR IDENTIFICATION |
| --- | --- |
| 102 | 0.1 μf |
| 103 | 0.1 μf |
| 104 | 0.1 μf |
| 105 | 6 KΩ |
| 106 | 6 KΩ |
| 107 | 330 Ω |
| 108 | 7.5 Ω |
| 109 | HP HSMS-2822#L30 |
| 110 | HP HSMS-2822#L30 |
| 111 | 0.1 μf |
| 112 | 3 KΩ |
| 113 | 0.1 μf |
| 114 | 75 Ω |
| 115 | 0.1 μf |

As previously described, the attenuator 100 uses the non-linear current produced by the diodes 109, 110 to compensate for the voltage compression caused by an NLD. As shown, the attenuator 100 comprises capacitance, resistance and two diodes. The diodes are the only components that are sensitive to temperature change and the only components that require correction during operation over a wide temperature range. There are three factors which must be taken into consideration when operating the attenuator 100 over a wide temperature range:

1) The diode operating current will change if the bias voltage remains constant while the ambient temperature changes. Under the same input voltage swing at the input port 101 and the same bias voltage, more non-linear diode current will be created as the ambient temperature rises.
2) When the ambient temperature rises, the diode will produce less non-linear correction current for the same input signal voltage and the same diode bias current.
3) NLDs typically exhibit more distortion as the ambient temperature rises. Accordingly, a higher diode non-linear current is required for correction of the greater distortion.

All of the temperature effects experienced by the attenuator 100 are related to the bias voltage. Some of the effects are additive while others are subtractive. However, the result is that for a given temperature, there will be an optimum bias voltage to produce the proper correction output. Proper temperature correction will be achieved when there is a predefined change of bias voltage verses temperature.

Figure 7:
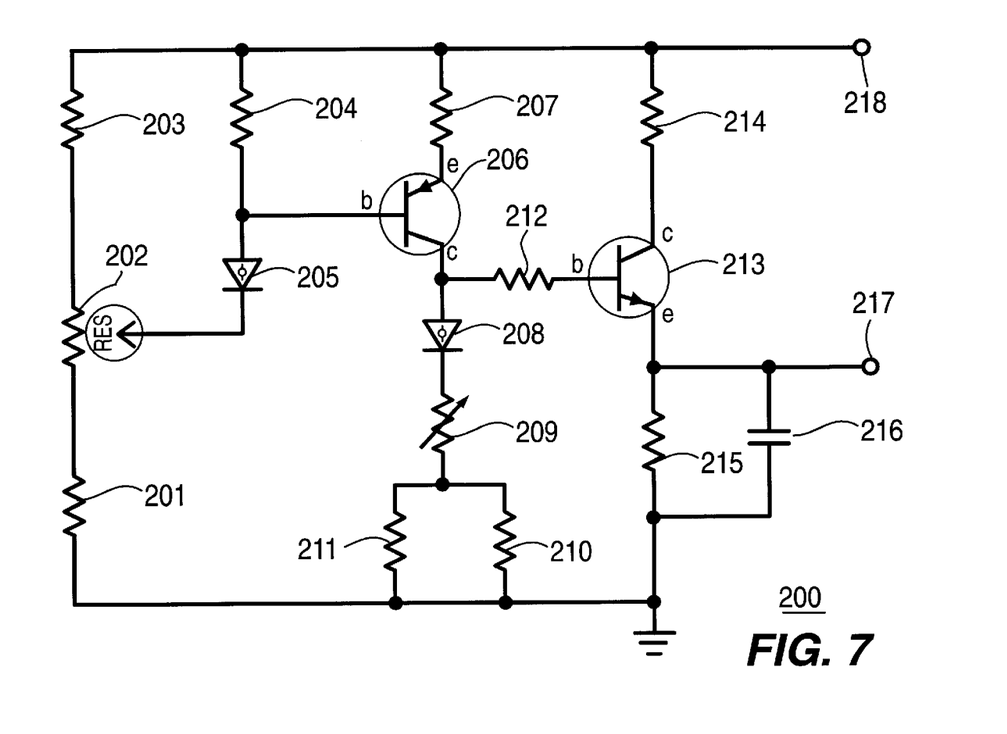
FIG. 7 is a schematic diagram of the temperature compensation circuit.

Referring to FIG. 7, the preferred embodiment of the temperature compensation circuit 200 is shown. The temperature compensation circuit 200 controls the bias of the diodes 109, 110 (shown in FIG. 6) for optimum compensation of the distortion. As shown, the temperature compensation circuit 200 comprises two transistors 206, 213; a capacitor 216; nine resistors 201, 202, 203, 204, 207, 209, 210, 214, 215; two diodes 205, 208; and a negative temperature coefficient thermistor 211.

The negative temperature coefficient thermistor 211 is coupled in parallel with resistor 210 to form a linearized resistance, which is correlated to a change in temperature. The PNP transistor 206 provides a constant current source through its collector to the linearized resistor combination 210, 211. The constant current provided by the PNP transistor 206 induces a linearized voltage change across the resistor combination 210, 211 as the temperature changes. By adjusting the value of the variable resistor 202, the amount of constant current through the PNP transistor 206 can be changed. Therefore, the voltage swing over temperature can be changed. The constant current also passes through the variable resistor 209, thereby creating a constant voltage drop that is used as a starting bias point for bias voltage adjustment. By selectively adjusting the resistance of resistors 202 and 209, any combination of voltage swing and starting bias voltage can be obtained. A NPN transistor 213, which is an emitter follower transistor, provides the control bias voltage from line 217 through line 116 to the attenuator 100, as shown in FIG. 7. The two diodes 205 and 208 are used to compensate for the junction voltage of the two transistors 206, 213 which change over temperature.

Table 2 provides a listing of the components shown in FIG. 7. However, one skilled in the art would clearly recognize that the values shown in Table 2 are only for example, and should not be considered to be limiting to the invention.

TABLE 2

| COMPONENT | VALUE OR IDENTIFICATION |
| --- | --- |
| 201 | 16 KΩ |
| 202 | 3.3 KΩ |
| 203 | 4.7 KΩ |
| 204 | 50 KΩ |
| 205 | 1N4148 |
| 206 | 2N3906 |
| 207 | 2 KΩ |
| 208 | 1N4148 |
| 209 | 1.5 KΩ |
| 210 | 2 KΩ |
| 211 | DKE 402N10 |
| 212 | 100 Ω |
| 213 | 2N3904 |
| 214 | 100 Ω |
| 215 | 3 KΩ |
| 216 | 50 μf |

It should be recognized that the present invention provides an instant voltage controlled non-linear attenuator design combined with a bias supply for optimum non-linear correction efficiency and bias temperature stability. Even if the temperature compensation circuit 200 as disclosed herein is not utilized, the preferred embodiment of the present invention provides adequate distortion correction over a broad temperature range. When the temperature compensation circuit 200 is utilized, the distortion compensation results can be further improved. Accordingly, a trade off between the performance of the compensating circuit and the complexity of the circuit must be weighted.

What is claimed is:

1. An external distortion control circuit for selective attenuation of a signal comprising:
   a signal input port;
   a non-linear circuit coupled to said input port and comprising:
      an attenuator network comprising first, second and third resistors coupled in a π configuration;
      a pair of non-linear elements coupled together in parallel with each other and said second resistor, each said non-linear element comprising a diode in series with a capacitor, and said capacitors being coupled together; and
      a fourth resistor, coupled across said coupled capacitors; and
   an output port for outputting said selectively attenuated signal from said non-linear circuit.

2. The distortion control circuit of claim 1 further including a DC bias voltage circuit.

3. The distortion control circuit of claim 2 further including a temperature compensation circuit coupled with said DC bias voltage circuit, for selectively adjusting said DC bias voltage in response to a change in ambient temperature.

4. The distortion control circuit of claim 1 wherein said second resistor generates a voltage proportional to said input signal; whereby said proportional voltage creates a non-linear current through at least one of said diodes in said pair, thereby creating a non-linear resistance to selectively attenuate said signal.

5. The distortion control circuit of claim 3 wherein said temperature compensation circuit comprises:
   a constant current source transistor with an output;
   a second transistor, coupled to said output of said current source transistor, for outputting said DC bias voltage;
   a linearized resistance circuit having a thermistor coupled in parallel to a second resistor; and
   a variable resistor that couples said current source transistor to said linearized resistance circuit;
   whereby the linearized resistance circuit is correlated to said change in ambient temperature.

6. The distortion control circuit of claim 1 whereby said non-linear circuit provides selective attenuation of the signal based upon the magnitude of said signal; whereby less attenuation is provided for larger signal magnitudes and more attenuation is provided for smaller signal magnitudes.

7. The distortion control circuit of claim 1 wherein the insertion loss at said output port is less than 0.5 dB.

8. An external distortion control circuit for selective attenuation of a signal comprising:
   a signal input port;
   a non-linear circuit coupled to said input port and comprising:
      an attenuator network comprising first, second and third resistors coupled in a π configuration;
      a pair of non-linear elements coupled together in parallel with each other and said second resistor, each said non-linear element comprising a diode in series with a capacitor, and said capacitors being coupled together; and
      a fourth resistor, coupled across said coupled capacitors;
   an output port for outputting said selectively attenuated signal from said non-linear circuit; and
   a single D.C. voltage bias input.

9. The circuit of claim 8 wherein said bias input is adjustable.

* * * * *

UNITED STATES PATENT AND TRADEMARK OFFICE
CERTIFICATE OF CORRECTION

PATENT NO.    : 6,577,177 B2
DATED         : June 10, 2003
INVENTOR(S)   : Zhou et al.

It is certified that error appears in the above-identified patent and that said Letters Patent is hereby corrected as shown below:

<u>Column 9,</u>
Line 10, delete the word "it", and insert therefor -- $\pi$ --.

Signed and Sealed this

Fourteenth Day of October, 2003

JAMES E. ROGAN
*Director of the United States Patent and Trademark Office*